(12) United States Patent
Haukness (10) Patent No.: US 8,508,998 B2
(45) Date of Patent: Aug. 13, 2013

(54) MULTIPLE PLANE, NON-VOLATILE MEMORY WITH SYNCHRONIZED CONTROL

(75) Inventor: Brent Steven Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 163 days.

(21) Appl. No.: 13/147,474

(22) PCT Filed: Dec. 23, 2009

(86) PCT No.: PCT/US2009/069504
§ 371 (c)(1),
(2), (4) Date: Aug. 2, 2011

(87) PCT Pub. No.: WO2010/090691
PCT Pub. Date: Aug. 12, 2010

(65) Prior Publication Data
US 2012/0020161 A1   Jan. 26, 2012

Related U.S. Application Data (60) Provisional application No. 61/151,148, filed on Feb. 9, 2009.

(51) Int. Cl.
*G11C 16/10* (2006.01)
(52) U.S. Cl.
USPC ............ 365/185.17; 365/185.11; 365/185.22; 365/185.23

(58) Field of Classification Search
None
See application file for complete search history.

(56) References Cited

U.S. PATENT DOCUMENTS

| | | | |
|---|---|---|---|
| 6,081,450 A | 6/2000 | Nawaki | |
| 6,442,076 B1 | 8/2002 | Roohparvar | |
| 6,735,116 B2 * | 5/2004 | Lee et al. | 365/185.17 |
| 7,280,398 B1 | 10/2007 | Lee | |
| 7,366,023 B2 * | 4/2008 | Ju | 365/185.23 |
| 7,911,842 B2 * | 3/2011 | Park et al. | 365/185.11 |
| 8,031,525 B2 * | 10/2011 | Park | 365/185.11 |
| 2004/0100827 A1 | 5/2004 | Fasoli et al. | |
| 2007/0097775 A1 | 5/2007 | Ju | |
| 2007/0233939 A1 | 10/2007 | Kim | |

OTHER PUBLICATIONS

EP Extended Search Report mailed Oct. 18, 2012 re International Application No. 09839836.5. 7 pages.

* cited by examiner

*Primary Examiner* — Tan T. Nguyen
(74) *Attorney, Agent, or Firm* — Marc P. Schuyler (57) ABSTRACT

This disclosure provides a multiple-plane flash memory device where high voltage programming (setting) or erasing (resetting) pulses are timed to occur simultaneously. By regulating when each memory plane (e.g., each logical or physical partition of memory having its own dedicated array control and page buffer) applies high voltage pulses, the overhead circuitry needed to control multiple concurrent operations may be reduced, thereby conserving valuable die space. Both the "program phase" and the "verify phase" of each state change operation cycle may be orchestrated across all planes at once, with shared timing and high voltage distribution.

38 Claims, 5 Drawing Sheets

MULTIPLE PLANE, NON-VOLATILE MEMORY WITH SYNCHRONIZED CONTROL

BACKGROUND

Non-volatile memory can retain stored information without the continual requirement of short-interval refresh operations; for these reasons, non-volatile memory can potentially save power and extend the functionality and usability of portable devices. To reduce cost, certain forms of non-volatile memory have been designed for programming or erasing in units of minimum size ("pages" or "blocks"). A typical limitation of these designs, however, is that it often takes a relatively long time to program or erase data, often on the order of hundreds of microseconds or longer. Because devices based on these designs typically cannot be used for other purposes while such a state change operation is in progress, a bottleneck can be created.

Figure 1:
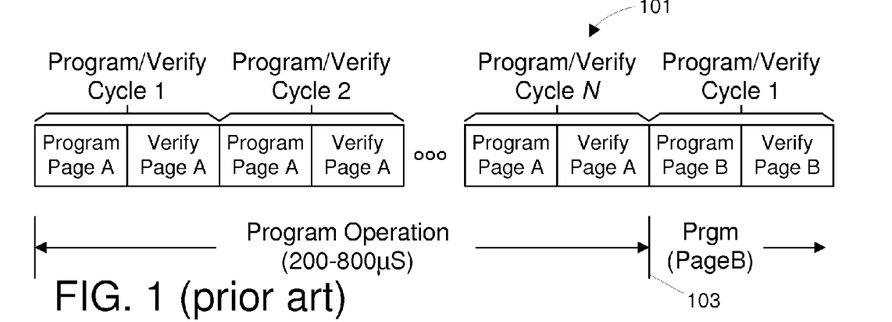
FIG. 1 presents a timing diagram 101 that is used to illustrate conventional multiple-cycle state change operations. Each of the cycles is termed a "program-verify cycle" or "PV cycle," with the same basic method being used for both erasing operations ("reset" or "resetting" operations) and for programming operations ("set" or "setting" operations).

The conventional state change of a page or block of such memory is introduced with reference to a timing diagram 101 seen in FIG. 1. The processing includes a number of cycles, each termed a "program-verify cycle" or "PV cycle" (this term is used for both programming and erasing operations, despite the presence of the word "program" in the term). With each cycle, high voltage circuitry on-board the memory device (that is, several times a reference voltage provided to the chip, or approximately 20-30 Volts DC) is used to apply one or more voltage "pulses" to cells within a page or block to urge them toward a desired logic state (e.g., contents of a logic "1" in the case of "erasing" or "resetting," or one of two alternative binary values, logic "1" or logic "0," in the case of a typical "programming" or "setting" operation). Several such pulses are often used, because an incremental approach helps avoid "over-programming" (i.e., to apply the smallest voltage possible for the smallest amount of time, and so avoid high electric fields which can damage cells). Each individual pulse is usually part of a discrete state change cycle (i.e., a "program phase" of the PV cycle), with the memory device performing a verification of memory contents after each pulse (a "verify phase" of the PV cycle) to detect deviations within the cells of the block or page from desired state or states. If any cells in the page or block have not assumed the correct state, a further state change cycle is then applied, up to a number "N" of such cycles. In some designs, the voltage can be increased between cycles in an attempt to provide additional impetus. Not all designs use this latter technique. As indicated by FIG. 1, the complete state change operation for a particular page or block, often consisting of as many as 10-20 PV cycles, can take hundreds of microseconds or longer (represented by a time 103), effectively preventing the memory device from being used for other operations. For example, if it is desired to program a second page "B" as depicted in FIG. 1, a controlling device (e.g., a memory controller) must typically wait a minimum time 103 before it can do anything.

Thus, a need exists for ways of reducing the bottleneck and thereby enhancing the potential application of non-volatile memory devices. The present invention satisfies these needs and provides further, related advantages.

BRIEF DESCRIPTION OF THE DRAWINGS

FIG. 2 is a block diagram of a memory apparatus 201, implemented as a memory device. The device has a multiple-plane flash memory core 203, with individual planes labeled "plane 1," "plane 2" and "plane N," to indicate that the device may include any number of planes. State logic 211 for each memory plane, shared control and sequence logic 215 and optional shared high voltage distribution circuitry 217 are used to distribute a high voltage reference within the apparatus for simultaneous state change operations across memory planes.

FIG. 3 is a block diagram of a single plane 301 of memory; unlike the individual memory planes depicted in FIG. 2, FIG. 3 depicts a page buffer 307 and state logic 327 as an integral part of each plane.

FIG. 4 also illustrates the presence of a register 413 to store state information for use in managing a multiple-plane memory device.

FIG. 7 illustrates an embodiment where a shared voltage distribution system distributes voltage to all of the planes. Multiple voltages are seen to be used in the management of each plane; some voltages (such as ground, "$V_{read}$," "$V_{dd}$" and "$V_{pass}$") may be distributed for direct use by each memory plane, while other voltages may be distributed as maximums, for localized scaling or modification by each plane ("$V_{prog\text{-}max}$" and "$V_{misc\text{-}max}$" are depicted in the FIG. for this purpose).

DETAILED DESCRIPTION

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of operating a nonvolatile memory cell, in a manner that has control synchronized across multiple memory "planes," and (ii) a device based on such a method, implemented for example as a flash memory device. The invention, however, may also be applied to other methods and devices as well.

Embodiments presented below provide memory apparatuses that employ multiple "planes" with shared control circuitry, and a related method of operation. As used herein, a "plane" is a logical or physical partition of memory served by a dedicated sense array and associated page buffer. Circuitry which may be shared includes at least some of the circuitry that generates and manages the state change operations for plans of the associated memory apparatus; in some embodiments, voltage distribution circuitry (e.g., high voltage generation circuitry such as generates "increased" voltages relative to chip or device input voltage) may also be shared. For example, the shared circuitry used to generate and manage state change operations may include shared sequence control circuitry, which orchestrates voltage pulse operations (used to change state) in a manner that is concurrent for all planes undergoing state change. That is to say, common control over the sequence of operations used by the device (e.g., the timing of state change operations) may be applied such that the programming and erasing operations get applied to all planes (undergoing state change) at the same time, without substantial overhead circuitry dedicated to each plane for these tasks. If desired, at least some high voltage circuitry can also be shared between the planes, such that a high voltage gets centrally generated and is then farmed out to the various planes simultaneously.

In an integrated circuit embodiment, the use of multiple planes and shared control circuitry in this manner conserves valuable die space, and is consistent with trends toward miniaturization. For example, a conventional memory device having multiple "banks" may dedicate a significant percentage of die space, upwards toward fifty percent for some designs; the use of multiple planes and shared circuitry as taught herein helps promote smaller devices, with several embodiments being presented below. These embodiments generally facilitate latency reductions by providing a multiple plane structure where (a) operations between planes may be concurrent, and (b) where operations in one plane may be initiated (once an associated data transfer has been completed) without being affected by write or read latency for a different plane (e.g., each plane may begin operations as its IO operations without awaiting completion of IO operations for other planes).

Implemented in a NAND flash device, the embodiments presented herein generally facilitate each of the following concurrencies:

(1) an erase operation for a block of memory in one plane may be concurrent with a programming or erasing of a page or block of memory in a second plane;

(2) a programming operation for a page of memory in one plane may be concurrent with programming or erasing of a page or block of memory in a second plane; and (3) a read operation for a page of memory in one plane may be concurrent with the programming or erasing of a page or block of memory in a second plane.

In the case of the first and second concurrencies, (1) and (2) above, a high voltage pulse (i.e., the "program" portion of a PV cycle associated with a state change operation in the first plane) may be applied in lockstep with a similar portion of a PV cycle associated with a state change operation in the second plane; if desired, timing may be applied to array control circuitry for each plane to also align the associated "verify" portion of each PV cycle. Simply put, the embodiments discussed below may align high voltage pulses across planes (for those planes undergoing a state change operation); in some more detailed embodiments discussed below, the orchestration of planes may be expanded such that the use of sense arrays for the planes may also be aligned, i.e., such that the timing of reads and the verify phases of PV cycles is applied in a manner common to all planes within a given memory device. Notably, concurrent reads are also facilitated using this structure, but this feature is not emphasized in the description below chiefly because read operations are typically relatively fast and do not substantially contribute to a bottleneck.

To avoid confusion with the terms "program-verify" or "PV" or "program buffer," the use terms programming and erasing (conventional for flash technology) as referring to change to a specific state will be minimized in the discussion below, with the terms "setting" and "resetting" (conventional for other forms of non-volatile memory) instead being used. The principles discussed herein nevertheless apply to flash memory as well as these other forms of non-volatile memory.

Figure 2:
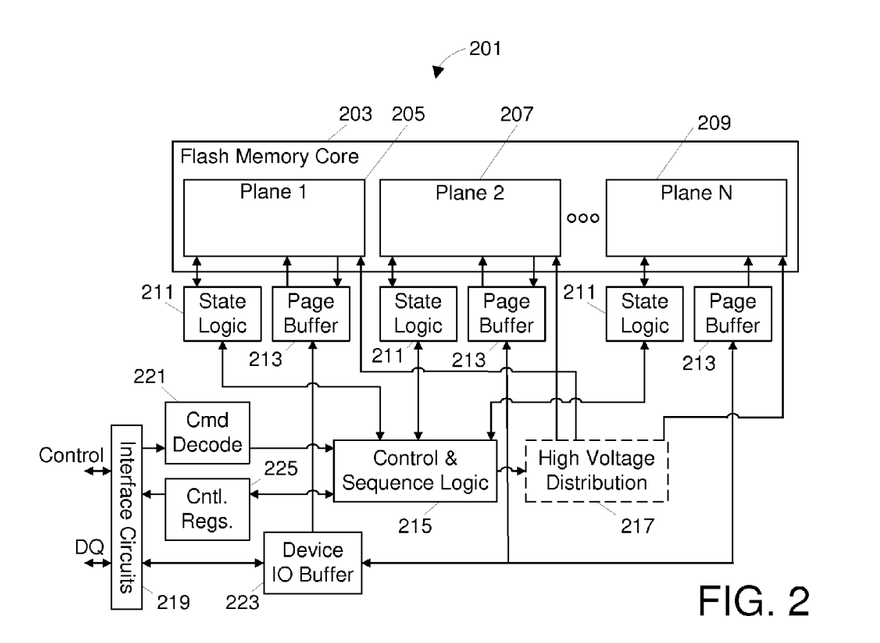

FIG. 2 shows a first embodiment of a memory apparatus 201. The apparatus is seen to include a flash memory core 203, having plural planes 205, 207 and 209; the planes are respectively labeled "plane 1," "plane 2" and "plane M" to indicate that any number of planes may be used. The configuration of each one of these planes is identical for the depicted embodiment. Each plane will have its own memory array, sense array (also referred to herein as "sense amplifiers"), array control circuitry, page buffer, program buffer, and state logic, with only the latter of these two 211 and 213 depicted in FIG. 2.

To support concurrency, FIG. 2 also depicts some shared circuitry for the memory device 201, including a logic block 215 that represents control circuitry and sequence logic, optional shared high voltage distribution circuitry 217, interface circuits 219, a command decode block 221, a device IO buffer 223, and a set of control registers 225. The interface circuits receive commands from a memory control via an input/output ("IO") path labeled "control" and exchanges data in connection with a command via a "bus" of one or more signal lines labeled "DQ." The interface circuits 219 typically include chip select circuitry and routing circuitry so as to interpret address and command signal lines associated with the "control path." When a command is received, the command decode block 221 interprets the command. The command can be, for example, a command to erase a specific block, to store data in a specific page (in the case of a NAND flash memory implementation), to place data in or retrieve data from control registers 225, or to perform some other operation (e.g., a calibration, or to otherwise set an operational value for the memory device); in some implementations, the command may also be generic to a page represented by the page buffer. If data is to be received from a controller (as with the case of a setting operation), that data is received over the DQ bus and is loaded into the device IO buffer 223; since the DQ bus is typically of far less than of page-width, the cache 331 incrementally receives data from or outputs data to the DQ bus, with that data being at-once exchanged with the page buffer within the appropriate plane, as determined by the logic block 215. This structure may impart write or read latency which is in part mitigated by permitting state change operations in different planes to proceed at different times (i.e., with different PV cycle numbers).

The control registers 225 may be used for a number of functions as desired for the particular design. In one embodiment, these registers include a status bit that indicates for each plane whether an error has been experienced in set or reset operations ("state change operations") and/or whether such operations are completed. In this regard, the state logic for each plane 205, 207 and 209 is controlled so as to define these values, with the logic block 215 being used to update the control registers so that information is readily accessible to device control logic or to an external memory controller. If desired, the state logic may be integrated with the command registers, i.e., such that a single set of registers are used both for the function of representing state for a specific plane and for providing device operational information to an external controller. Other information may optionally be represented in the control registers, such as current status for each plane (e.g., "in a state change operation"). If desired, this information (e.g., status) may also be indicated on a separate device bin, such as via a "read/busy" signal.

The error value may be used to indicate if a state change operation has "timed-out" or, equivalently, whether such an operation has successfully completed without error. In this regard, sometimes memory cells are degraded through use to a point where they can no longer be reliably set or reset. For example, NAND flash memory designs at the time of filing this disclosure typically have an expected operational lifetime of on the order of 100,000 erase/write cycles per cell, a number that can vary from manufacturer-to-manufacturer, device-to-device and from cell-to-cell. A designer may therefore wish to implement (for flash memory embodiments) a timer or maximum PV cycle number, which generates an error flag in the command registers if the timer or maximum number is exceeded (i.e., so that the memory apparatus does not attempt in vain to perform a doomed state change operation). Again, this information may be stored and determined with reference to the state logic 211 for each plane, i.e., the state logic may be used to track PV cycle number, time of setting or reset operations, or other information. Any mechanism may be used which is sufficient for the controller to determine when a relatively long state change operation has completed (e.g., hundreds of microseconds) and to make an assessment that a page or other unit of memory has not correctly changed state using normal techniques. If a flag is raised in the register, the controller may be made aware of its status through a signal transmitted over the command bus, through an interrupt, a controller polling cycle, or another mechanism.

As mentioned earlier, one advantage of the embodiment of FIG. 2 is that high voltage distribution circuitry 217 may if desired be shared across planes, further enabling more efficient die size (for integrated circuit designs). To this end, the embodiment of FIG. 2 includes sequence logic, represented as part of logic block 215, to sequence all planes to march in lockstep. That is to say, the sequence logic generates master timing information, used for state change and for reading/verify operations by each plane. This information may also be used to regulate the sharing of pulses (e.g., via a common set of charge pumps) across planes. The sequence logic may include an oscillator that produces an internal clock, and counters and other standard timing signal generation circuitry to produce master program and read/verify timing signals of appropriate duration. In one embodiment, the timing and duty cycle of these signals may be made to be programmable (e.g., by external management of the control registers 225, or for example, through a hard-wire, factory defined, blown fuse, run-time or other configured value). The pulses generated by this logic are distributed to the high voltage distribution circuitry and to the state logic 211 for each memory plane 205, 207 or 209 to apply voltage pulses and to control the sense arrays for those planes that are then-subject to a state change operation. Otherwise put, although each plane is adapted to concurrent operations, it is not required that all planes have their cells set, reset or read at once, and a function of the state logic 211 in the embodiment of FIG. 2 is to coordinate timing with those planes that are to receive a high voltage pulse, and those planes that are to have their sense arrays used for outputting or verifying data. The state logic 211 therefore cooperates with the shared high voltage distribution circuitry 217 (if present) to ensure that high voltage signals are applied just to those planes and associated memory cells that are currently the subject of state change operations (set or reset operations).

In the depicted embodiment, high voltage distribution circuitry 217 generates several reference voltages, which can then physically routed to each plane 205, 207 or 209. A number of such voltages may be employed in array operations, but for present discussion, it should be assumed that a single high voltage (e.g., "$V_{prog-max}$") is to be generated from a device supply voltage and distributed in common to multiple planes; additional voltages and detail of the high voltage distribution circuitry will be discussed below, especially in connection with FIGS. 7-9. If the design is one where voltage of the same pulse is used in each PV cycle, this reference voltage can be used "as-is" without further scaling. For designs where each successive PV value applies greater impetus (i.e., a higher voltage), a relatively high voltage reference may be distributed (e.g., "$V_{prog-max}$," greater than an external reference voltage applied to the device) with a scaling circuit dedicated to each plane and used to scale down this voltage according to the PV cycle—if the cycle number is small, the voltage may be more aggressively scaled (e.g., 18 VDC, depending on design), whereas if the cycle number is large and previous PV cycles have been unsuccessful, scaling may be little to none (e.g., a maximum voltage, on the order of 30 VDC for some designs, may be applied). Notably, different planes undergoing state change operations may reflect different PV cycle numbers, with sets, resets or reads for different planes occurring in a time-staggered manner; an advantage of a scaling circuit implementation is that different voltages may be locally derived from each plane based on a globally distributed and timed maximum reference voltage. In an alternative design, the high voltage distribution circuitry 217 may distribute a number of high voltage reference signals to all planes, with state logic for each plane selecting one or more of these voltages. For example, the high voltage distribution circuitry 217 could be implemented to globally distribute seven voltage signals, e.g., 18 VDC, 20 VDC, 22 VDC, 24 VDC, 26 VDC, 28 VDC and 30 VDC, with the state logic for each plane being used to determine which voltage should be applied for state change operations. If desired, the timing signals generated by the sequence logic of block 215 may be applied at the high voltage distribution circuitry 217 (i.e., such that the voltage is globally pulsed) and/or distributed and used locally and independently by each plane to synchronize their operations, including reference voltage application and delivery.

Figure 3:
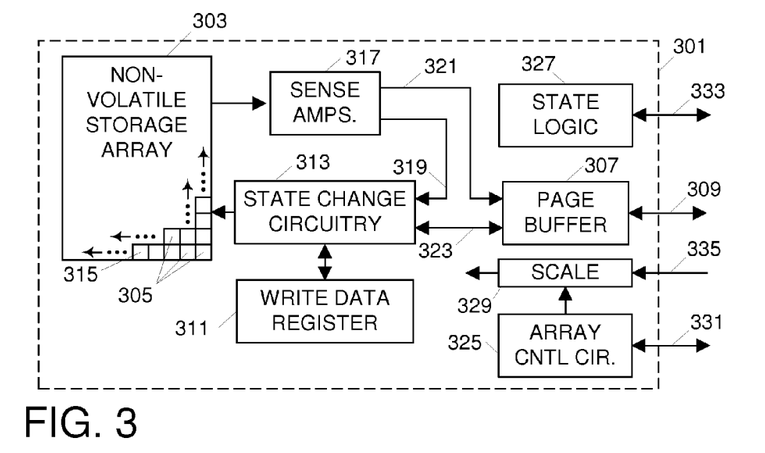

FIG. 3 is presents a block diagram of one embodiment of a single memory plane 301. This specific example is depicted to include a dedicated page buffer 307 and array control circuitry 325. The plane includes a non-volatile storage array 303, which effectively includes a great many memory cells 305; for example, the embodiment of FIG. 3 may be configured as an 2 gigabyte (GB) flash memory device with 2-4 planes, each plane associated with a 1 GB-500 MB array (logical or physical partition). Each array is a group of cells having separate wordline and bitline control (and associated page buffer and sense array), regardless of whether the group is electrically contiguous with another array or is physically partitioned. Each array may be further organized into units of minimum programming or erasing size. In the case of a NAND flash memory implementation, where memory cells are selectively "set" or not "set" in units of pages and memory cells are together "reset" in units of blocks, a typical page size might be approximately 4,096 bytes (32,768 bits), such that each plane would contain approximately 262,144 pages of memory, with 64-128 pages to each block. The plane receives inbound and provides outbound data using a dedicated page buffer 307, which serves as a plane-specific cache for pages of data that are to be written into or read out of the plane via an IO path 309. The plane also includes a write data register 311, which is controlled by state change circuitry 313 to assist with setting operations. In this regard, the state change circuitry is used to set or reset memory cells 305 in the array using sense amplifiers (e.g., a sense array) 317 to verify cell contents in one or more PV cycles; an internal path 319 is used for this purpose. The sense amplifiers 317 also respond to data reads by filling the page buffer 307 over path 321 with individual pages of memory. FIG. 3 also depicts array control circuitry 325, state logic 327, localized voltage scaling circuitry 329 and associated IO paths 331, 333 and 335.

As alluded to earlier, each memory cell may reflect silicon processing variations and variation in defect density, creating variation in the ease with which each cell may be set or reset; multiple PV cycles may therefore be applied as introduced earlier, with sense amplifiers 317 being used after a state change pulse to determine whether each cell in a page or block (as appropriate) has assumed the desired state. For example, in the case of a reset operation, the array control logic is used to read a block of memory cells, with the sense amplifiers 317 providing a digital signal for each cell that represents cell contents. If any cells (i.e., as few as one or more) have not assumed the desired logic state (typically a logic "1" or high voltage reading for each cell in the array), a new PV cycle is initiated. For setting operations, the sense array outputs digital signals representing memory cell contents for a page of memory, and these values are "exclusive-OR'd" against the contents of the write data register 311, with the result replacing the contents of the write data register. The write data register is also sometimes called the "program buffer." The result is that the contents of the write data register then represents only those cells that have incorrect state (i.e., since an reset operation is typically applied with flash before a setting operation, the program buffer typically indicates just those cells that are to be set or "programmed" to a logic "0" or low voltage state, but which are not yet in that state). The write data register 311 is then ready for use in a subsequent PV cycle and, as with the reset operation, such a subsequent cycle is triggered unless all cells in the page or block have assumed the desired state. In the case of an reset operation, the desired state is that all cells in the block are "verified" by the sense amplifiers 317 to contain a logic "1." In the case of a setting operation, the desired state is that the write data register 311 following the verify portion of the PV cycle represents all logic "1's" (or "0's," depending on the particular design), indicating that there are no cells remaining to be correctly set.

Three further points should be understood with respect to the embodiment of FIG. 3. First, for each plane, the sense amplifiers 317 are also used for read operations, that is, when it is desired to read a particular page out of memory, the array control circuitry 325 drives the array to nondestructively output information stored in a page to the sense amplifiers 317, and this information in turn is loaded into the page buffer 307. Second, the page buffer 307 depicted in FIG. 3 is essentially a page-sized cache used to hold outbound "memory reads" to be returned to a memory controller, as well as inbound "memory writes" that will be fed to the write data register. Not all embodiments require a page buffer as illustrated, while some implementations can use multiple page buffers, depending on the objectives of the designer. Third, to manage the application of PV cycles and to implement the application of concurrent, high voltage pulses (as will be further described below), each plane also has associated with it dedicated state logic 327 that tracks the state of each memory plane. That is to say, one advantage presented by the embodiment of FIG. 3 is that the memory apparatus facilitates concurrent state change operations or one or more shared state change operations and reads, in different planes, with each plane adapting to setting, reset or memory read operations initiated at different times. The functions of the state logic will be elaborated upon further below; as implied by comparison of FIGS. 2 and 3, however, the state logic may be bundled with each plane, may be centrally maintained by each memory device (with portions of the logic dedicated to each plane), or may be maintained elsewhere within a memory apparatus (e.g., by a memory controller).

Figure 4:
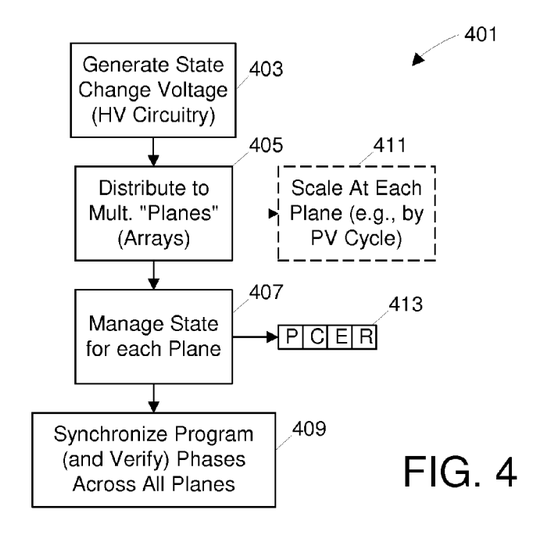
FIG. 4 is used to present a method 401 of operating non-volatile memory.

A method used for this embodiment is represented by FIG. 4, and is generally designated by numeral 401. As indicated by this figure, a voltage is generated, for example, by the distribution circuitry just described, as referenced by numeral 403. This voltage is distributed to multiple planes, or arrays, as indicated by numeral 405. Notably, while each plane is associated with an array, this correspondence is used both to encompass situations where one large array is logically partitioned to generate an array for each plane, as well as other situations. Each plane is independently managed in its state such that it can be used for concurrent operation, as indicated by numeral 407. Per numeral 409, irrespective of whether a particular plane is undergoing a state change operation or read operation, or is idle, the program phases across all planes are synchronized. The result of this synchronization in the embodiment discussed above has no effect for planes that are not undergoing a state change operation or are idle, but for those planes that are in the process of a state change operation, this synchronization causes any high voltage pulses associated with setting or resetting to be applied concurrently across the planes, i.e., such that a set of high voltage circuitry can be shared across all planes associated with a single device or system. Alluding to the operation referred to just above, as indicated in phantom lines by numeral 411 to indicate optional methodology, the synchronization may utilize a globally distributed high voltage reference, with this voltage being scaled or otherwise modified at each plane, e.g., by PV cycle number.

FIG. 4 also presents one example of a state register 413, consisting in this case of four entries, respectively labeled "P," "C," "E," and "R." These entries respectively designate that (a) the plane is undergoing a state change operation, (b) an on-going state change operation has a multi-bit value PV cycle number, representing cycles performed thus far, (c) an error has been detected (e.g., the page or block has not correctly changed state prior to time-out or prior to a PV cycle maximum), and (d) the plane is fulfilling an in-progress read operation. The particular state register depicted in FIG. 4 is exemplary only, i.e., more, fewer or different values may be used. To provide a first example, an additional value that defines a controller-defined maximum number of PV cycles may be stored in the state register and, if desired, the error flag may be omitted (i.e., an error can be implied by a PV cycle number which equals the controller-defined maximum). Alternatively, the cycle number may be omitted and some other mechanism used to detect error, such as a time-out mechanism. To provide another example, the value indicating ongoing state change operations may be omitted (e.g., and another mechanism, such as a non-zero PV cycle number, can be used to effectively conveying the same information). A skilled designer may design state information and register configuration to convey any desired information for use in managing and synchronizing overall device operations.

Figure 5:
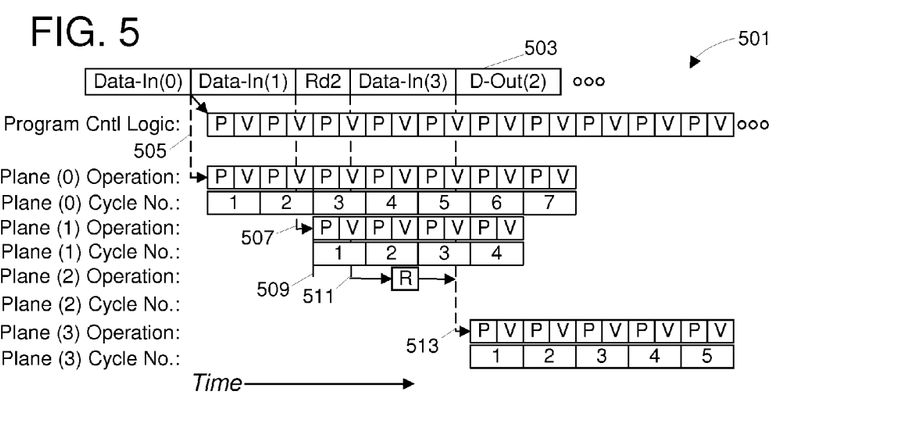
FIG. 5 presents a timing diagram 501 used to explain how the structures and methods presented in FIGS. 2-4 may be used to permit concurrent operations across multiple planes. For the example of FIG. 5, it should be assumed that a memory apparatus includes four separate planes, numbered 0-3. A top bar 503 represents the IO path utilization, in terms of requests and data transmissions; timing entries beneath this top bar 503 illustrate synchronization of each of "program phases" and "verify phases" of multiple cycle state change operations, in a manner where high voltage pulses are substantially concurrent (for those planes having a state change operation ongoing). In the embodiment of FIG. 5, each plane supports concurrent, independently-initiated memory operations.

FIG. 5 presents a timing diagram 501 used to explain how the structure and method presented in FIGS. 2-4 may be used to permit concurrent operations across multiple planes. For the example of FIG. 5, it should be assumed that a device includes four separate planes, numbered 0-3. A top bar 503 represents the IO path utilization from the standpoint of the memory device, in terms of requests and data transmissions. The various values indicated represent time-multiplexed commands and data for (A) a memory write to plane 0 ("Data-In(0)"), (B) a memory write to plane 1 ("Data-In(1)"), (C) initiation of a data read operation for page 2 ("Rd2"), (D) a memory write to plane 3 ("Data-In(3)") and (E) the transfer of the data for the previously-initiated read operation (i.e., the actual transfer of data responsive to "Rd2") ("D-Out(2)"). As indicated by ellipses to the right the top bar 503 (i.e., to the right of "D-Out(2)"), this sequence is exemplary only and would ordinarily continue with other memory operations. By facilitating multiple plane operations, it can be seen that these IO functions can significantly increase IO path utilization, i.e., the value "Data-In(0)" represents time needed to send a state change command and a page of data (not to be confused with the overall state change time which may be many multiples of this time—the value "Data-In(0)" would typically be on the order of microseconds for an entire page of data, and the write time may be on the order of hundreds of microseconds).

Below the top bar 503, a number of operations are compared, each labeled at the left side of FIG. 5. The first listed operation is phase of the control and sequence logic, which in this embodiment essentially consists of uninterrupted switching between program and verify phases, with each pair of phases "P" and "V" representing a single PV cycle. The control and sequence logic in this embodiment continuously generates these phases whenever power is applied to the represented memory device; in other implementations, a designer may implement these phases such that they are active (i.e., such that they exist) only when one or more planes in the array are to be subject to set or reset operations, initiated when the control and sequence logic receives a corresponding command from a controller. Still further, a designer may wish to interrupt these cycles with other device functions or operations, or alternatively, to vary a duty cycle associated with each "P" phase and "V" phase (these phases do not have to be of equal or invariant duration). Irrespective of the particular timing, the control and sequence logic can orchestrate all planes under its control to these "P" or "V" phases.

Thus, for example, when a command to write data in to plane 0 is received (as represented by "Data-In(0)" in the top bar 503), the control and sequence logic loads data accompanying this command into plane 0's page buffer and transfers this information to the write data register for plane 0 (if the state change operation is a set operation, as opposed to a reset operation), at a time indicated by a first vertical timing line 505. The associated plane, plane 0, then prepares for initiation of a state change operation by initializing the associated state logic and awaiting the next orchestrated program phase applied to all phases of the apparatus. Thus, plane 0 is controlled to match its state change operations to the phases of the control and sequence logic, as depicted in FIG. 5 by aligned "P" and "V" durations. In this example, and for the planes referenced by FIG. 5, multiple state change operations are illustrated as taking 7, 4 and 5 PV cycles for proper state change, respectively, but it should be understood that ordinarily this number of cycles will vary depending on operation type, data being written, and silicon variations for the particular plane and the affected memory cells. The number of state change operations may be any number from 1 to dozens, depending upon design and any applied maximum. Second and third labels at the left side of FIG. 5 respectively indicate phase of the state change operation occurring in plane 0, and the associated PV cycle number.

When a second state change command is received, for example, as represented by "Data-In(1)" in the top bar 503, the operation is similar to that just described. Normally, the controller (not seen in FIG. 5) would manage issued commands so as to avoid sequential commands to the same plane (e.g., the controller would queue a second command to the same plane until processing of a first command is complete) or, alternatively, the memory device's control and sequence logic may queue commands to the same plane (e.g., using the state logic to determine if the plane in question is free and one or more buffers for queuing purposes). In the example of FIG. 5, the second state change command is identified as destined for plane 1, so there is no conflict with ongoing operations in plane 0. A second vertical line 507 represents initialization of plane 1 to begin the state change operation and, accordingly, this operation is initiated in synchrony with the next occurring program phase, as orchestrated by the control and sequence logic—this synchrony is identified by numeral 509 in FIG. 5. Notably, the state change operation in plane 1 is illustrated as hypothetically taking four PV cycles.

The ensuing command is illustrated to be a read command for the third plane ("Rd2"), which is fully received and interpreted at a time represented by numeral 511. In this example, the third plane is illustrated as idle through this point in time and, because the read involves use of the sense amplifiers for the third plane, this read operation is timed to be in synchrony with the next verify phase of the control and sequence logic (as referenced by alignment of a timing block "R" with a verify block "V"), so as to be contemporaneous with verify operations for the first and second planes (plane 0 and plane 1). This data is loaded into the page buffer for the associated array, such that it is prepared for transmission to the external controller, to fulfill the read request. The read data remains in the page buffer subject to controller scheduling, that is, until the controller requests actual transfer of the data. Needless to say, in this embodiment, the controller provides all DQ bus scheduling and arbitration, including timing the transfer of sensed read data in a manner interlaced with write data and other transfers.

When a third state change command is received, represented by "Data-In(3)" in FIG. 5, this data is loaded to the third plane with operations also aligned to the control and sequence logic, beginning at the time identified by numeral 513. Following this command, because the IO pathway is now free, the external controller can then elect to retrieve the read data prepared for it from the third plane (plane 2). Thus, this data can be retrieved from the page buffer from the third plane, loaded into cache for IO operations, and sent through the IO interface to the controller over the DQ bus.

FIG. 5 illustrates several design features that can be obtained by operating multiple memory planes in the manner described. First, for those planes that are undergoing a state change operation, the "program phase" and "verify phases" are orchestrated; thus, in FIG. 5, the "P" and "V" periods for the various planes vertically align and match overall device timing, as set by the control and sequence logic. Second, although the high voltage pulses associated with set and reset operations are constrained to occur at the same time, each plane can have a different PV cycle number as its operations may have commenced at different times (e.g., PV cycles 6, 4 and 1 are seen as contemporaneous for state change operations underway for planes 0, 1 and 3 in the example of FIG. 5). Finally, read operations in this example are constrained to occur at the same time as the verify phase for each plane, i.e., such that each plane is adapted to have its program phases (and associated high voltage pulse applications) at the same time by avoiding synchronization issues that might otherwise arise if a plane received sequential read and setting operations, and the read operation was not also orchestrated. This design philosophy is not required for all embodiments, i.e., it is possible to design systems where a read can occur in one plane at the same time that a high voltage pulse is applied in another.

Figure 6:
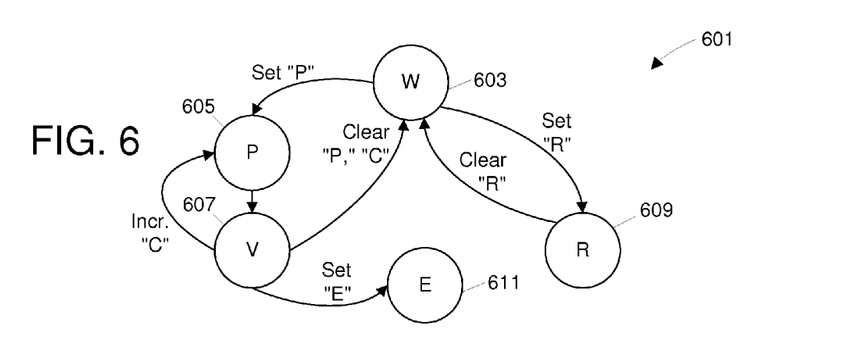
FIG. 6 presents a state diagram 601 for a memory plane implementation having five possible states; the states are represented by numerals 603, 605, 607, 609 and 611.

Notably, as mentioned earlier, state logic is used to identify and govern the operation of each plane, with array control logic for each plane managing array switching and similar operations to achieve desired function and to update state. FIG. 6 exemplifies the various states that a memory plane might be required to assume.

In particular, FIG. 6 presents a state diagram 601 that depicts five possible states, represented by numerals 603, 605, 607, 609 and 611. As represented by numeral 603, each plane can remain in a wait state ("W") when it is neither being read nor is the subject of a state change operation. When a state change operation is initiated, state logic for the plane initializes and then sets its "P" status bit to represent that it is currently undergoing a state change operation (represented by the union of the program phase 605, "P," and verify phase 607, "V"). If desired, each phase may be separately represented in the state logic (e.g., using an alternative to the register represented by FIG. 4's numeral 413). The plane then continues in this state (or states 605 and 607) until state change operations are successfully completed, or until an error condition ("E") is determined. With each verify phase, if the state change has not been successfully completed, the cycle number "C" is incremented, and the device then begins a new PV cycle (represented by state 605). If at the end of verification it is determined that the state change has been completely successful for the page or block of memory (as appropriate), the state logic can then clear its "P" flag and cycle number, or can otherwise signal to the control and sequence logic that its state change operation has terminated and that it is again "free." If a maximum PV cycle number has been reached and the most recent verify phase does not indicate proper state change for the entire page or block of memory at-issue, the state logic can set the error flag "E" and proceed to state 611. The memory device and its associated system may be designed to respond to this state with controller intervention, e.g., by marking the associated block of memory as "bad" in a manner transparent to the memory device, and the controller and the control and sequence logic for the device can then clear the error flag and reinitiate desired operations for the plane (e.g., for blocks unaffected by the error). In the depicted embodiment, the error flag "E" may be used by the control and sequence logic or the controller to identify the memory plane as busy and otherwise needing attention, with ensuing commands to that plane being queued until resolution. As indicated by state 609, a read state can also be initiated out of the wait state 603 when a read command is directed to the plane in question. The plane can set the "R" bit associated with its state logic when the command is received, and can then clear the "R" bit when contents have been transferred out to the device cache for transmission to the controller (the setting and clearing operations can be performed by state logic, by the control and sequence logic or by the controller, depending on embodiment).

Figure 7:
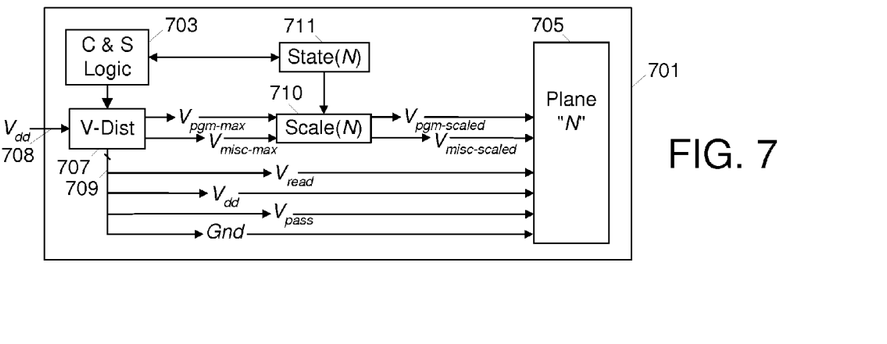
FIG. 7 provides a simplified view of a memory apparatus 701 that includes only a single plane of memory 705 (typically, more than one plane is present).

FIG. 7 presents a block diagram showing exemplary voltage distribution in a memory apparatus 701. The apparatus is depicted to include control and sequencing logic 703 and a single memory plane 705. The single memory plane 705 is labeled "plane N" to indicate that a number of planes should be assumed to be present; in the embodiment of FIG. 7, however, only a single plane is illustrated to simplify the discussion of voltage distribution. In this regard, voltage distribution circuitry 707 receives a reference voltage "$V_{dd}$," designated by numeral 708 in FIG. 7. This voltage may be provided by an external power supply; for example, if the memory apparatus is embodied in a single integrated circuit, mounted to a PC board-based system, the voltage 708 may be a system-wide reference voltage provided by the system, typically on the order of 1.5-5 VDC. The voltage distribution circuitry generates two groups of signals, including a first group of signals 709 that are distributed for use in all array operations (i.e., without scaling). For example, FIG. 7 illustrates signals labeled "Gnd" (ground), "$V_{pass}$" used as one reference voltage in set operations), "$V_{dd}$" (used to power some plane-specific logic), and "$V_{read}$" (used for read operations). A second group of signals is passed to a scale circuit 710 dedicated to "plane N," for scaling as appropriate; these signals are labeled in FIG. 7 as "$V_{pgm-max}$" and "$V_{misc-max}$," respectively, indicating that these voltages may include a maximum high voltage reference, for use in state change operations, and one or more other voltages. In some implementations, it may be desired to scale or adjust voltages such as "$V_{read}$" in a plane specific manner and, thus, "$V_{misc-max}$" may be represent one or more of the voltages from the first group 709. The scaling circuit 710 is in this example in communication with state information 711 for the corresponding plane so that, for example, a maximum high voltage reference may be scaled, according to PV cycle. It is for this reason that the scaling circuit is seen to produce corresponding voltages, "$V_{pgm-scaled}$" and "$V_{misc-scaled}$," representing plane specific voltages. The arrangement depicted in FIG. 7 is exemplary only, i.e., not all embodiments require shared voltage distribution, localized scaling, or the use of state information as a part of voltage distribution.

It was earlier mentioned that in some embodiments, a memory device can be configured to allow a controller or other circuitry to vary certain values, for example, for use during run time. One example of such a configuration can be a maximum number of PV cycles for each plane. For example, instead of having a fixed maximum number of PV cycles, a controller can effectively calibrate a memory device, or even logical subdivisions, by tracking typical programming and erasing times; should it be found through practice that a particular memory page always programs within 6 PV cycles, it may not make sense to permit a maximum number of 20 PV cycles; a problem in operation in this hypothetical could instead be detected if the page in question did not change state correctly within 6 PV cycles. By tracking actual usage or performing a periodic calibration, a controller can define operational values to take advantage of better-than-worst-expected case performance. A controller can similarly monitor typical program and/or verify times for a typical PV phase for a device, with a system being designed to permit programmatic or calibrated adjustment of the orchestrated timing for a particular memory device, via calibration of duty cycle, program phase time, validate phase time, or other, similar parameters.

Figure 8:
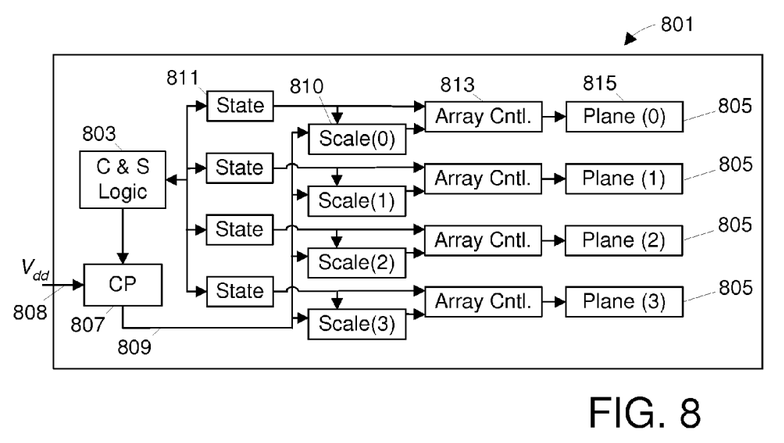
FIG. 8 provides a detail view of a memory apparatus 801 that uses a scaling circuit to apply high voltage pulses for multiple plane state change operations. The depicted memory device includes shared control and sequencing logic 803 and shared high voltage circuitry 807 (implemented as a charge pump).

FIG. 8 provides a detail view of a memory apparatus 801, namely, one that uses a scaling circuit to apply high voltage pulses for state change operations. In particular, the apparatus includes control and sequencing logic 803 and a high voltage circuit 807 implemented as a charge pump. In this example, the charge pump receives a relatively low voltage $V_{dd}$ (designated by numeral 808 in FIG. 8) which the charge pump multiplies to obtain the much higher voltages used for state change operations (e.g., for a NAND flash memory implementation). The charge pump may include several cycles or states which rely on charging a capacitor or other circuit, and then boosting that charge, via one or more iterations. For example, the input voltage $V_{dd}$, may be on the order of a few volts (e.g., 2-5 VDC) and may be boosted up to 30 VDC for state change operations. A high voltage signal 809 is then distributed by the charge pump for common use by each of the multiple planes of memory, at least those planes currently undergoing a state change operation (e.g., a set or reset operation).

In the embodiment of FIG. 8, the high voltage circuitry (e.g., the charge pump) 807 distributes a maximum voltage with that maximum voltage being scaled down as needed by support circuitry for each memory plane. In this example, each plane has a dedicated scaling circuit 810 which receives the maximum (reference) high voltage for use in state change operations. Since each one of four planes 805 depicted in the memory device of FIG. 8 is identical, only one of these (the top-most) is numbered for purposes of description. Notably, as with the other implementations described herein, the presence of four planes is for purposes of illustration only, and nearly any number of planes may be used, e.g., 2-16. The scaling circuit works in cooperation with the state logic dedicated to the corresponding plane to apply the proper high voltage for state change operations. For example, if it is assumed that up to 13 PV cycles will be applied as a maximum (as determined by the systems designer, limited by the memory device or as determined by the memory controller manufacturer, as appropriate), with voltage increasing each PV cycle by 1 VDC and spanning 18 VDC and 30 VDC, a maximum reference voltage of 30 VDC or greater could be distributed as the reference voltage 809. Each scaling circuit would then scale this voltage according to the PV cycle number, for example, using the multi-bit value of "C" stored in register 413 from FIG. 4. In this example, the scaling circuit could apply a value for example, of 17 VDC+1 VDC for each PV cycle, beginning with PV cycle 1 (18 VDC) and terminating after the application of PV cycle 13 (30 VDC). This illustration is used for example only, and nearly any scaling methodology may be used in implementing the system of FIG. 8 in a manner that distributes and then scales a common high voltage reference for state change operations. The appropriate voltage, together with state, would then be used by the array control circuitry 813 dedicated to the particular plane 815 to perform a set or reset operation for a particular memory page (in the case of a NAND flash embodiment). The apparatus depicted in FIG. 8 may be implemented as a NAND flash device, for example, as a chip or another form of non-volatile memory device (e.g., as a part of a jump drive, application specific circuit, or other form).

Figure 9:
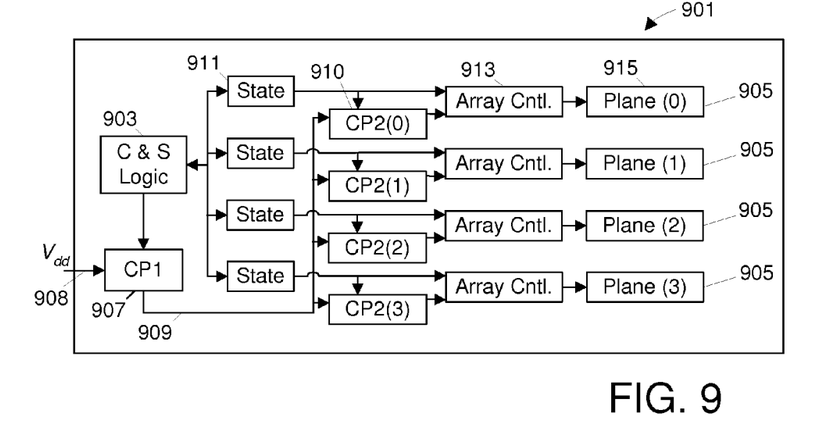
FIG. 9 presents another embodiment of a multiple-plane, non-volatile memory apparatus 901; instead of using scaling circuitry, however, the memory apparatus of FIG. 9 uses two separate tiers of charge pump circuits, respectively labeled "CP1" and "CP2." The first tier is embodied as a shared charge pump circuit that distributes a high voltage reference signal for use by each one of the multiple planes; each plane also has its own, dedicated second tier charge pump circuit to further increase voltage (for use in embodiments that increase voltage between PV cycles).

FIG. 9 presents another embodiment of a non-volatile memory device 901, namely, one which distributes a high voltage reference for common use by multiple memory planes 905, but which does not use scaling circuitry. In particular, control and sequence logic 903 for the device generates timing and other signals which are distributed to the state logic 911 for each memory plane 905. As with the example presented above, the embodiment of FIG. 9 also relies upon a charge pump circuit 907 as its high voltage circuit. However, unlike the previous embodiment, the system of FIG. 9 distributes a substantially smaller reference voltage, for common use by multiple memory planes. For example, the embodiment of FIG. 9 may be used to distribute a reference voltage 909 of 17VDC, with this smaller voltage 909 being also distributed and used by a second charge pump circuit "CP2" 910 associated with each memory plane. Thus, instead of scaling a maximum reference voltage down, the embodiment of FIG. 9 uses a second charge pump circuit 910 to increase voltage above a minimum, for use with devices that rely on increasing PV cycle voltage as part of the state change process. As with the examples presented above, the appropriate voltage, together with state, would then be used by the array control circuitry 913 dedicated to the particular plane 915 to perform a state change operation for a particular memory page (in the case of a NAND flash embodiment).

Other variants on these implementations will also occur to those skilled in the art, such as devices that use only a single high voltage (without adjusting voltage between PV cycles) or which use alternatives to scaling down a maximum or increasing a base reference voltage.

Figure 10:
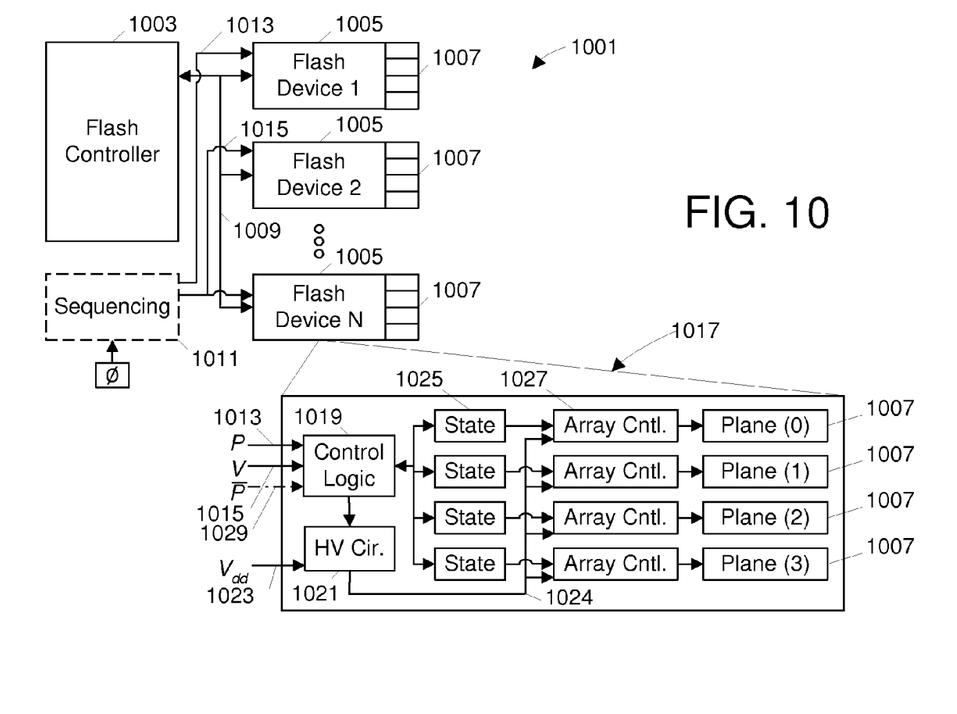
FIG. 10 illustrates another embodiment of a multiple-plane memory apparatus 1001, where a controller 1003 and several multi-plane memory devices 1005 are implemented to form a complete memory system. Each memory device 1005 is seen to include four planes 1007; in this embodiment, however, the timing used for concurrent phase state change operations is generated external to each memory device (e.g., by the controller or by the system), and is distributed to each device in tandem with an IO pathway 1009.

FIG. 10 illustrates another embodiment, where several multi-plane memory devices are implemented in a full memory system 1001. The system in this case should be assumed to be a flash memory system that includes a controller 1003 and a series of "N" memory devices 1005, where N is at least two. In the illustrated case, each memory device 1005 is seen to include four planes 1007, controlled according to the methods presented above. FIG. 10 also illustrates an IO pathway 1009 for the memory devices and an optional external sequencing block 1011 (illustrated in phantom) to indicate that in the depicted apparatus, the sequence logic (or at least the timing components) may be removed from a single memory device and orchestrated for the entire memory system. In this case, the sequence logic generates one or more timing signals (e.g., to time the application of high voltage pulses for state change operations and, if desired, to time sense array operations for read and verify operations to globally function in tandem with the program phase of each PV cycle). Two timing signals 1013 and 1015 are illustrated for this purpose. If desired to minimize system peak power consumption, the devices may be arranged in pairs or some other duty cycle arrangement (e.g., in three or more sets), where each memory device is managed so as to operate its charge pumps and other high voltage circuitry in a manner so as to minimize peak power draw, i.e., with all planes of one ("odd") memory device performing a "program phase" while all planes of another ("even") memory device perform a "verify phase." Otherwise stated, in this embodiment, each one of several discrete memory devices (e.g., integrated circuits) may operate with a single, concurrent program phase or verify phase, but operations may if desired be staggered as between chips. To effectuate this operation, the second timing signal 1015 could be driven as a complement to the first timing signal or in a manner offset from the first timing signal. In yet another variant of the system of FIG. 10, each memory device could be controller-programmed to have a phase offset, i.e., so as to have a delay for each memory device such that its orchestrated operations (as directed by operational block 1011) would be internally delayed relative to global timing, so as to achieve an analogous offset.

The bottom-most memory device (device "N") is also depicted in expanded detail, depicted by reference numeral 1017. Each of the "N" memory devices in FIG. 10 is identical in design and, hence, only the "Nth" such device will be described in detail. In particular, each device may be a flash memory chip (integrated circuit) having its own onboard control logic, 1019, and high voltage circuitry 1021. In this case, the high voltage circuitry may again be a charge pump that is used to derive a high voltage signal from a relatively low voltage chip input voltage $V_{dd}$, labeled 1023 in FIG. 10. For example, $V_{dd}$ may be on the order of 5 Volts DC ("VDC") or less, while the charge pump may output a much larger voltage, e.g., 18-30 VDC. Any of the techniques mentioned above may be used to apply high voltage pulses for the program phase of the PV cycle. For example, the generated charge pump voltage 1024 may be applied as generated (and may be the same for each PV pulse), or it may be scaled or fed into a second charge pump circuit dedicated to each plane, as has been described earlier. Other techniques may also be used. The control logic 1019 also couples to state logic 1025 for each memory plane in a manner effective to initiate and resolve state change operations, reads, and other memory functions, as described earlier. In cooperation with array control circuitry 1027, these elements gate the application of high voltage to just those memory planes that have initiated state change operations, and synchronize operations between planes. As with examples used earlier, only one plane (the top-most plane) is labeled in detail in FIG. 10 as, in this embodiment, each plane is substantially identical in design.

The left side of the expanded detail memory device, 1017, also shows three timing signal inputs, provided in this embodiment by the external sequence logic 1011. That is to say, timing in this embodiment may be orchestrated for a multiple device system around one or more timing signals, 1013, 1015 and 1029 (the latter of these is indicated in phantom lines to indicate its optional nature). The sequence logic may be driven by appropriate PC board or memory board circuitry, implemented as a part of a flash controller's support circuitry, and driven off of a system or other reference clock (labeled "Ø"); alternatively, this logic may also be integrated into the controller itself, as part of an integral chip, and routed as part of the IO pathway 1009. In FIG. 8, the first signal 1013 is labeled "P" to indicate that it represents a system identification of the "program phase" of each PV cycle, with the device in question (1017) ensuring concurrency of high voltage pulses across its multiple memory planes, as applicable. The second signal 1015 is labeled "V" to indicate that it represents a system identification of the "verify phase" of each PV cycle, with the device 1017 ensuring concurrency of sense amplifier operations, as applicable. The use of two separate timing signals may be appropriate where it is desired to provide a system with independent control over the program phase and the verify phase, e.g., if program and verify phases make up only a part of total device timing. The third, optional signal 1029 is labeled "not P" (i.e., "P" with a horizontal line overhead) and is depicted for use in possible alternative embodiments. For example, it was mentioned above that one embodiment features the use of "odd" and "even" phased memory devices, to reduce peak power consumption; the third signal 1029 may be used to time such phases. The provision of such additional timing signals facilitates enhanced flexibility in terms of timing the use of each memory device, and may or may not be pertinent to a particular design. Other possibilities will also occur to those having ordinary skill in the art.

The embodiments presented above provide advantages in terms of reducing die size and are consistent with increased trends toward circuit miniaturization. Conventionally, an eight bank memory device might occupy approximately double the die size of a single bank memory device (of exactly the same overall storage capacity) because of the overhead circuitry required to manage the banks. By helping to minimize the overhead circuitry, the embodiments discussed above present the advantage of reducing latency in memory operations with potentially substantially less overhead circuitry penalty. The latency reductions may be in the form not only of improvements to programming latency (i.e., to mitigate the bottleneck of PV cycle latency), but also to write and read latency as well, because individual planes can be assigned operations as soon as transfers of their associated data is complete, without having the need to await completion of transfer times (e.g., write latency) associated with other memory planes. Embodiments presented above also present other substantial advantages, among them flexibility in terms of adjustable parameters, peak power minimization, and other benefits as well. By facilitating concurrency between memory planes, each plane may be operated such that its cells may be set, reset or read independently from any other memory plane. Otherwise put, the concurrency enables a controller with suitable scheduling faculties to time-multiplex operations in different memory planes, with significantly reduced bottleneck.

Various alternatives to the foregoing techniques will readily occur to those having skill in the art. For example, as mentioned, the described techniques can be implemented in other forms of devices, including other forms of nonvolatile memory. Other mechanisms for facilitating concurrency are also possible, including circuits and techniques other than the specific high voltage control or selection mechanisms presented above, and other than the specific timing mechanisms presented above.

Figure 11:
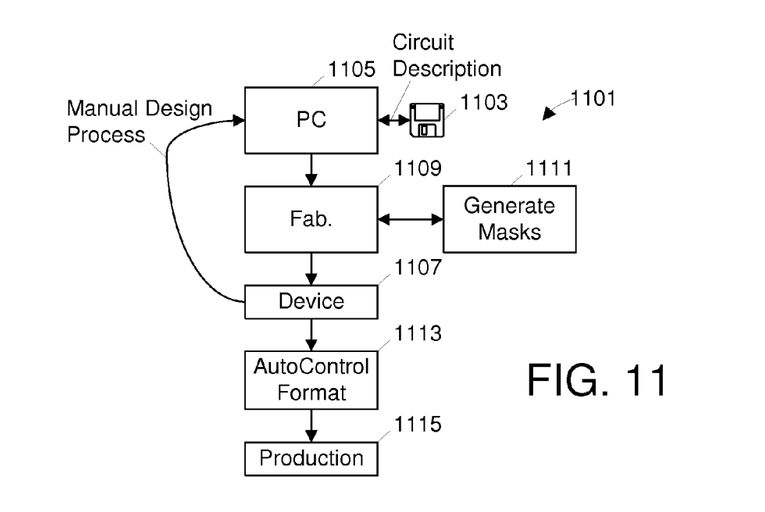
FIG. 11 illustrates a design process that relies on a machine-readable media 1105, used by a computer 1103 to design and used, later, to fabricate individual memory devices (e.g., integrated circuits).

It should be noted that the various circuits disclosed above may be described using computer aided design tools and expressed (or represented), as data or instructions embodied in various machine-readable media (i.e., storage media recognizable by computers, such as in electronic memory, CD-ROM, DVD, optical, magnetic or other formats used to read data by machines). FIG. 11 illustrates such an embodiment 1101. In particular, machine-readable media 1103 may be used by a computer, such as a personal computer 1105, to design or fabricate an integrated circuit using data stored on the machine-readable media. If desired, the media may alternatively reside internal to the computer (e.g., in the form of data stored on internal electrical, magnetic or optical storage circuitry). The data stored on the media defines a circuit and is ideally in a form which may be used and modified by a designer and applied to the fabrication of physical devices (e.g., chips, such as flash memory chips embodying the principles discussed above). The data may be expressed in terms of their behavioral, register transfer, logic component, transistor, layout geometries, or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES. Other suitable formats and languages may also be used. When received within a machine such as a computer system, such data or instructions may be processed in connection with execution of one or more computer programs including, without limitation, net-list generation programs, place and route programs and the like, to generate a representation or image of a physical manifestation 1107 of such circuits. The representation or image may thereafter ideally be used in fabrication, for example, by enabling generation of one or more masks that are used to form various components of the circuits, for example, as indicated by reference numerals 1109 and 1111. Resultant devices may be evaluated, with desired changes incorporated back into the data describing the device, as part of a manual design (change) process. Once the design is suitably refined, the data stored on machine readable media may be converted to a format used in the direct control of circuit manufacturing devices, as indicated by a phantom line block 1113. The ultimate use in a production run environment is identified by reference numeral 115 in FIG. 11.

It is also possible to apply the teachings presented above to devices that do not utilize PV cycles, or that use a different form of PV cycle operation than the methodology presented above. Importantly, for those devices that do use PV cycle operations, a wide variety of controller-memory device interchange formats exist, including formats where the memory device controls each PV cycle in a manner transparent to the controller, and formats where the controller manages the process and specifically commands each PV cycle, or commands each program and verify portion separately. All such operations are contemplated as within the scope of this disclosure.

The embodiments discussed above are primarily couched in terms of flash memory, NAND flash memory in particular, but the teachings of this disclosure may be applied to other forms of memory. For example, a number of designs for non-volatile memories are currently proposed or are in development, including designs based on flash memory, phase or state change memory, magnetic random access memory ("magnetic RAM" or "MRAM"), resistive RAM, metalized RAM, nanowire RAM and other technologies. Although known by a wide number of acronyms and names, these designs usually are based on a material (usually a metal or semiconductor) that reversibly changes a physical or electrical state under the application of a voltage, field, current, or other effect; the state can be nondestructively sensed, thereby permitting use of the state for information storage. In many of these forms, the terms "program" and "erase" are referred to using other, similar terms, for example, "set" and "reset;" also, while particular storage units of "page" and "block" have been referred to above in reference to a NAND flash memory embodiment, the selection of these units is arbitrary, and the teachings presented above can be applied to other forms of logically or physically partitioned (or un-partitioned) memory space as well. It should be possible to apply teachings from this disclosure to all such forms of memory.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. The term "coupled" is used herein to express a direct connection as well as a connection through one or more intervening circuits or structures. The term "exemplary" is used to express an example, not a preference or requirement. Also, the verb "charge" and reference to "charging" expressed above should be understood to refer to current flow in either direction, i.e., current flow in the FIGS. and discussion may be expressed in terms of absolute magnitude or current, and may be driven using positive or negative voltages or current flows, or both, depending on implementation.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

The invention claimed is:
1. A nonvolatile memory apparatus, comprising:
at least two planes, each plane having
a plurality of memory cells,
a buffer to hold data for data transfer for the associated plane, and array control circuitry;
state logic for each of the planes (a) to apply plural state change cycles to the associated plane and (b) to track at least whether the associated plane is currently undergoing state change operations; and
sequence control circuitry to cause the array control circuitry for each of the at least two planes to concurrently apply a voltage pulse for the associated plane when undergoing state change operations;
where the non-volatile memory apparatus is to perform state change operations concurrently for the at least two planes, in a manner not necessarily synchronized by cycle number.
2. The apparatus of claim 1, where:
the apparatus further comprises shared voltage distribution circuitry to distribute in common to each of the at least two planes a shared voltage for use in state change operations; and
the array control circuitry for each plane is coupled to apply a voltage pulse based on the shared voltage to the associated plane in dependence upon the state logic associated with the plane.
3. The apparatus of claim 2, where the shared voltage distribution circuitry includes a high voltage distribution circuit to generate a state change voltage for distribution to all of the at least two planes, such that each uses at least one of a shared reset voltage or a shared set voltage without requiring a charge pump dedicated to each plane.

4. The apparatus of claim 3, where:
the high voltage distribution circuit generates a reference voltage;
the state logic is to identify a state change cycle number for the associated plane; and
the apparatus further comprises a voltage scaling circuit for each plane, the scaling circuit to receive the reference voltage as a maximum voltage and to scale the maximum voltage using the cycle number for the associated plane.

5. The apparatus of claim 1, where the sequence control circuitry generates a state change timing reference signal to time application of voltage pulses in a manner that is simultaneous across each of the at least two planes currently undergoing a state change operation.

6. The apparatus of claim 1, where:
the state logic further identifies whether the associated plane is allocated to a read operation;
the apparatus further comprises sense amplifiers for each of the at least two planes; and
the sequence control circuitry generates a read timing reference signal to control the reading of data by the sense amplifiers, such that the sensing of data for read and for verify operations for all state change cycles are synchronized across the at least two planes for at least those planes currently undergoing at least one of a state change operation or a read operation.

7. The apparatus of claim 1, embodied as an integral NAND flash memory integrated circuit.

8. The apparatus of claim 1, embodied as a memory system having a memory controller and at least one discrete memory device, where at least the sequence control circuitry is external to the at least one discrete memory device.

9. The apparatus of claim 8, where the state logic for each plane is external to the at least one discrete memory device.

10. The apparatus of claim 1, where the state logic identifies for a corresponding one of the at least two planes:
whether the corresponding plane is currently tasked to a state change operation;
state change cycle number; and
whether the corresponding plane is currently tasked to a read operation.

11. The apparatus of claim 10, where the state logic provides for the corresponding plane an indication as to whether the plane has correctly changed state for a state change operation in-progress.

12. The apparatus of claim 1, where the state change operation includes a reset operation.

13. The apparatus of claim 1, where the state change operation includes a set operation.

14. A nonvolatile memory device, comprising:
NAND flash memory cells arranged into at least two planes;
a buffer for each one of the at least two planes; and
means for applying program-verify cycles across all the planes in a manner constrained to have concurrent voltage pulses for at least one of programming or erasing operations but not necessarily synchronized by cycle number.

15. The device of claim 14, further comprising shared high voltage distribution circuitry.

16. The device of claim 14, further comprising means for applying program-verify cycles across all the planes to occur in a manner constrained to have concurrent sense array operations.

17. The device of claim 14, further comprising means for independently tracking program-verify cycle number for each plane, and for applying the program-verify cycle number to scale voltage for state change operations.

18. The device of claim 14, where the means applies program-verify cycles in a manner constrained to have simultaneous high voltage pulses for set operations.

19. The device of claim 14, where the means applies program-verify cycles in a manner constrained to have simultaneous high voltage pulses both for set operations and for reset operations.

20. A method of operating a nonvolatile memory apparatus, comprising:
generating a voltage for state change operations;
distributing the voltage to plural planes of memory, each plane having an associated array of memory cells and a buffer used for data transfer;
controlling state independently for each one of the plural planes, including tracking at least whether additional program-verify cycles are needed for memory cells within the associated plane to have a desired logic state; and
for planes that are subject to contemporaneous state change operations, using the voltage to perform state change operations.

21. The method of claim 20, further comprising using a shared high voltage distribution circuit and, for each plane, a voltage scaling circuit, the shared high voltage circuit to generate a high voltage reference for distribution to each plane and the scaling circuit to, for a specific plane, receive the high voltage reference as a maximum state change voltage, and to scale the maximum state change voltage using a program-verify cycle number.

22. The method of claim 21, further comprising generating a program timing reference signal to time application of voltage pulses from each scaling circuit to the associated plane in a manner that is simultaneous across each one of the plural planes undergoing a state change operation.

23. The method of claim 20, further comprising generating a read timing reference signal to synchronize sense array usage at least one of read operations or verify operations across all of the plural planes.

24. An apparatus, comprising:
a plurality of planes of NAND flash memory, each plane having an array of nonvolatile memory cells;
a buffer for each of the plurality of planes; and
circuitry to apply concurrent voltage pulses to effectuate concurrent state change operations in the plurality of planes;
where the NAND flash memory integrated circuit is to perform programming using a number of program-verify cycles, and is to perform state change operations concurrently for the at least two planes, in a manner not necessarily synchronized by program-verify cycle number.

25. The apparatus of claim 24, embodied as a NAND flash memory integrated circuit.

26. The apparatus of claim 25, where the NAND flash memory integrated circuit is to perform programming using a number of program-verify cycles, and is to perform sense array operations substantially simultaneously for a plane undergoing a read operation and a plane undergoing a verify portion of a program-verify cycle.

27. The apparatus of claim 24, where each buffer is to hold data for data transfer for the corresponding memory plane, the apparatus further comprising:
array control circuitry for each plane;

state logic for each plane to apply plural state change cycles to the corresponding plane and to track at least whether the corresponding plane is currently undergoing state change operations, and sequence control circuitry to cause the array control circuitry for each of the plurality of planes to concurrently apply a voltage pulse for the associated plane when undergoing state change operations.

28. The apparatus of claim 27, further comprising shared voltage distribution circuitry to distribute in common to each of the planes a shared voltage for use in state change operations, where the array control circuitry for each plane is coupled to apply a voltage pulse based on the shared voltage to the associated plane in dependence upon the state logic associated with the plane.

29. The apparatus of claim 24, where the memory cells are to undergo set and reset operations, and where the apparatus includes shared circuitry to provide a state change voltage for distribution to all of the planes, such that each plane undergoing a state change operation uses at least one of a shared reset voltage or a shared set voltage.

30. The apparatus of claim 24, further comprising circuitry to generate a timing reference signal to time application of voltage pulses in a manner that is simultaneous across each of the at least two planes.

31. The apparatus of claim 24, embodied as a memory system having a memory controller and a memory device integrated circuit, where the planes, the buffer and the circuitry are resident on the memory device integrated circuit.

32. The apparatus of claim 24, further comprising state logic to identify for each plane:
whether the plane is currently tasked to a state change operation;
a state change cycle number; and
whether the plane is currently tasked to a read operation.

33. The apparatus of claim 32, where state logic provides for the corresponding plane an indication as to whether the plane has correctly changed state for a state change operation in-progress.

34. A method of operating a nonvolatile memory apparatus, comprising:
providing nonvolatile memory cells arranged into at least two planes, and a buffer for each of the planes; and
applying voltage pulses to the planes in a manner constrained to be concurrent for a state change operation;
where the nonvolatile memory cells are flash memory cells, and where applying the voltage pulses includes applying concurrent state change operations across the planes in a manner that is synchronized but not necessarily by program-verify cycle number.

35. The method of claim 34, where the nonvolatile memory cells are flash memory cells, and where applying the voltage pulses includes sensing page contents for both read operations and programming operations across planes in a manner that is synchronized.

36. The method of claim 34, where the nonvolatile memory apparatus is a NAND flash memory integrated circuit.

37. The method of claim 34, further comprising using shared circuitry to generate a state change voltage, distributing the state change voltage to plural planes that are concurrently undergoing a state change operation.

38. The method of claim 37, further comprising scaling the state change voltage locally for each plane according to a program-verify cycle number.

* * * * *